United States Patent
Sugita et al.

(10) Patent No.: US 8,583,968 B2
(45) Date of Patent: Nov. 12, 2013

(54) DATA STORAGE APPARATUS AND METHOD FOR WRITING DATA

(75) Inventors: Takami Sugita, Ome (JP); Hiroyuki Moro, Hachioji (JP); Takahiro Nango, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 13/087,177

(22) Filed: Apr. 14, 2011

(65) Prior Publication Data

US 2011/0320868 A1 Dec. 29, 2011

(30) Foreign Application Priority Data

Jun. 23, 2010 (JP) ................................. 2010-143145

(51) Int. Cl.
*G06F 11/00* (2006.01)

(52) U.S. Cl.
USPC ............. 714/54; 714/6.1; 714/6.11; 714/6.13

(58) Field of Classification Search
USPC .................................. 714/6.1, 6.11, 6.13, 54
See application file for complete search history.

(56) References Cited

U.S. PATENT DOCUMENTS

| 6,868,007 | B2 | 3/2005 | Hasegawa et al. | |
|---|---|---|---|---|
| 7,617,437 | B2 * | 11/2009 | Moyer | 714/763 |
| 7,716,430 | B2 * | 5/2010 | Barnum et al. | 711/155 |
| 7,821,897 | B2 | 10/2010 | Fuchiwaki | |
| 2007/0127340 | A1 | 6/2007 | Fuchiwaki | |
| 2008/0148108 | A1 * | 6/2008 | Barnum et al. | 714/54 |
| 2011/0161784 | A1 * | 6/2011 | Selinger et al. | 714/768 |

FOREIGN PATENT DOCUMENTS

| JP | 2003-186758 A | 7/2003 |
|---|---|---|
| JP | 2004-199740 | 7/2004 |
| JP | 2005-078378 A | 3/2005 |
| JP | 2007-157279 | 6/2007 |
| JP | 2010-521014 A | 6/2010 |
| WO | WO 2005/109446 A1 | 11/2005 |
| WO | WO 2009/107286 A1 | 9/2009 |

OTHER PUBLICATIONS

Notice of Reasons for Rejection mailed Jun. 21, 2011, for Japanese Application No. 2010-143145.

* cited by examiner

*Primary Examiner* — Joshua P Lottich

(74) *Attorney, Agent, or Firm* — Knobbe, Martens, Olson & Bear LLP

(57) ABSTRACT

According to one embodiment, a data storage apparatus includes a read module, an error detector and a controller. The read module is configured to read data from a flash memory, more precisely from a rewrite area and a write-back area, both provided in the flash memory. The error detector is configured to detect errors, if any, in the data read. The controller is configured to keep rewriting data, without correcting the errors the error detector has detected in the rewrite area of the flash memory.

18 Claims, 4 Drawing Sheets

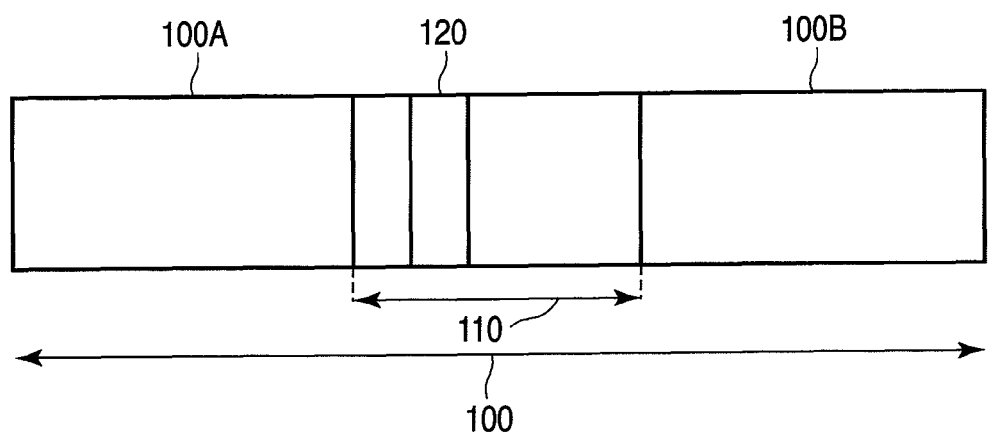
F I G. 3
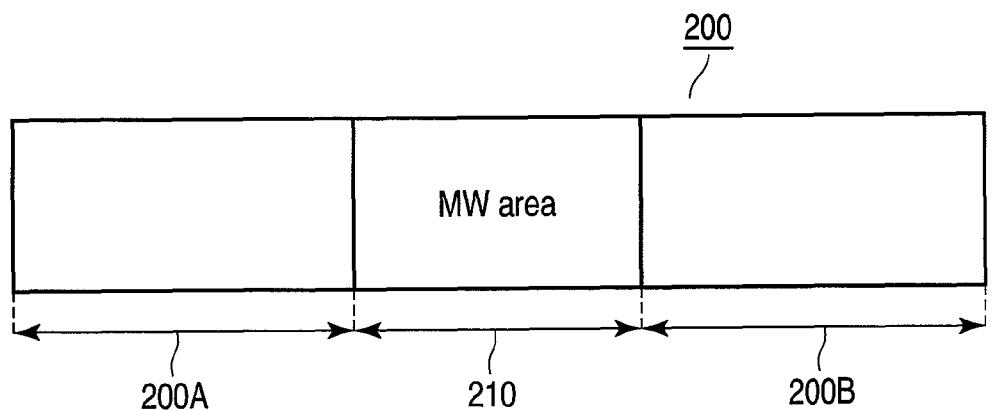
F I G. 4

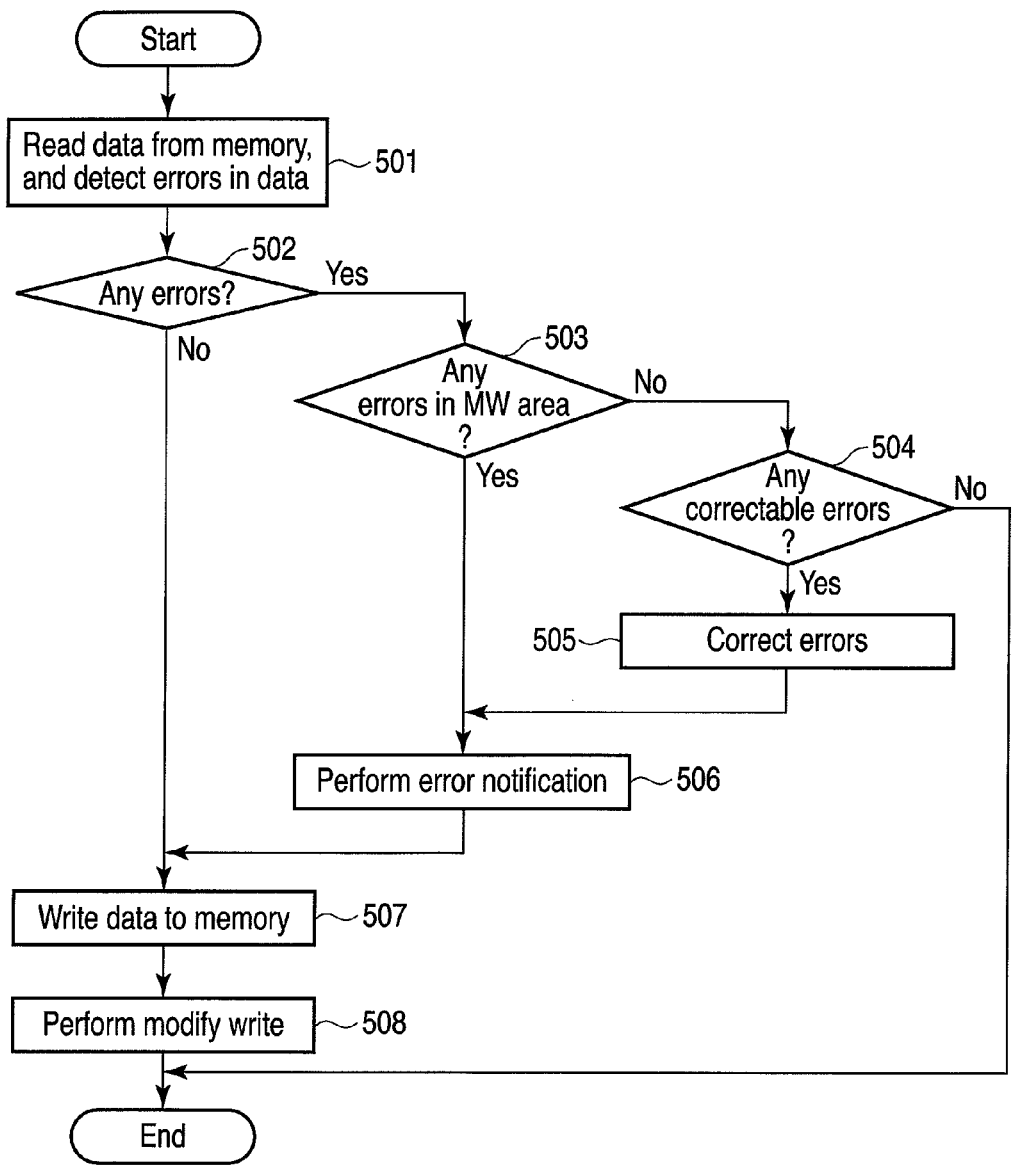
F I G. 5

DATA STORAGE APPARATUS AND METHOD FOR WRITING DATA

CROSS-REFERENCE TO RELATED APPLICATIONS

This application is based upon and claims the benefit of priority from Japanese Patent Application No. 2010-143145, filed Jun. 23, 2010; the entire contents of which are incorporated herein by reference.

FIELD

Embodiments described herein relate generally to a data storage apparatus that uses a nonvolatile memory as recording medium.

BACKGROUND

Solid-state drives (SSDs) have been developed as data storage apparatuses, each using NAND flash memories (hereinafter referred to as "flash memories" in some cases) that are rewritable nonvolatile memories.

In a write operation of the SSD, only a part of any cluster (for example, three sectors) may be rewritten (modified). This mode of writing data is occasionally called "read modify write (RMW)."

The cluster is an amount that of data can be logically accessed to a flash memory at a time. In most SSDs, one cluster is composed of a plurality of sectors, each being a physical access unit. For example, it is composed of eight sectors.

In the RMW mode, cluster data (i.e., one cluster of data) at an address to which data should be written is first read from a flash memory and is then saved in a buffer memory. When the data is read, error detection is performed on the data. If a read error occurs, it is corrected. The error correction needs a longer time than the error detection. If errors occur, the efficiency of data writing in the SSD will decrease at high probability.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is a diagram explaining how data is read in the RMW mode according to the embodiment;

FIG. 4 is a diagram explaining how data is written in the RMW mode according to the embodiment; and FIG. 5 is a flowchart explaining how the RMW is performed in the embodiment.

DETAILED DESCRIPTION

Various embodiments will be described hereinafter with reference to the accompanying drawings.

In general, according to one embodiment, a data storage apparatus includes a read module, an error detector and a controller. The read module is configured to read data from a flash memory, more precisely from a rewrite area and a write-back area, both provided in the flash memory. The error detector is configured to detect errors, if any, in the data read. The controller is configured to keep rewriting data, without correcting the errors the error detector has detected in the rewrite area of the flash memory.

[Configuration of the Data Storage Apparatus]

Figure 1:
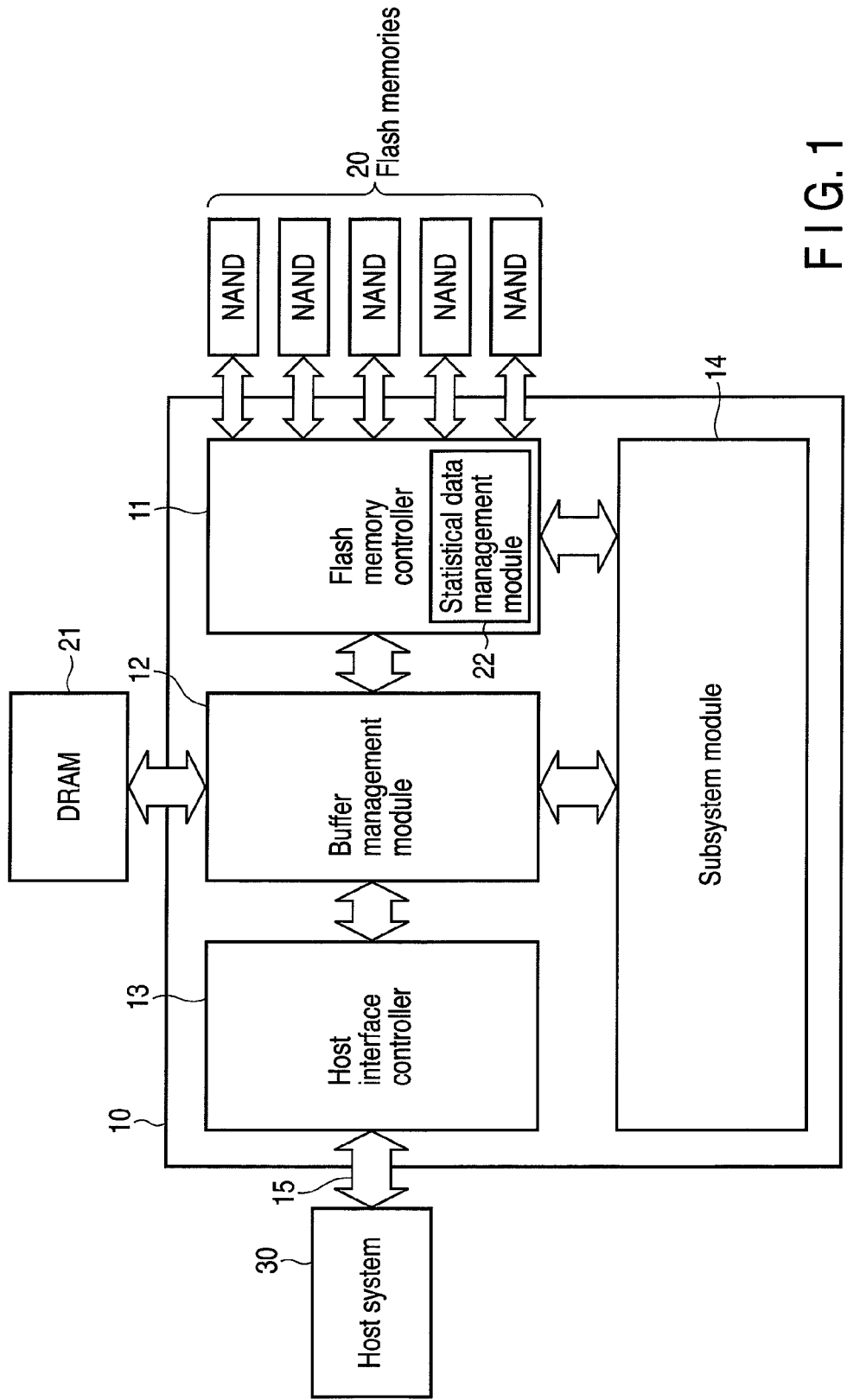
FIG. 1 is a block diagram explaining the configuration of a data storage apparatus according to an embodiment.

FIG. 1 is a block diagram showing the configuration of a data storage apparatus according to an embodiment.

The data storage apparatus according to the embodiment is a solid-state drive (SSD), which incorporates NAND flash memories as recording media. As shown in FIG. 1, the SSD includes an SSD controller 10, a plurality of NAND flash memories (flash memories) 20, and a dynamic random access memory (DRAM) 21. The flash memories 20 are data storage media used in the SSD, and are flash memory chips. The DRAM 21 is used as a buffer memory.

The SSD controller 10 has a flash memory controller (hereinafter referred to as a "memory controller") 11, a buffer management module 12, a host interface controller 13, and a subsystem module 14.

The memory controller 11 controls the transfer of read/write data from and to the flash memories 20. The memory controller 11 controls a statistical data management module 22 as will be described later with reference to FIG. 2. The buffer management module 12 controls the DRAM 21, thus controlling the data transfer to and from the buffer memory.

The host interface controller 13 controls the transfer of data and commands between a host system 30 and the SSD through a host interface 15. The host system 30 is, for example, a personal computer. The subsystem module 14 is constituted by a microprocessor and controls the other components of the SSD controller 10. In response to commands coming from the host system 30, the subsystem module 14 outputs commands to the memory controller 11. In accordance with these commands, the memory controller 11 may write and read data to and from the flash memories 20.

Figure 2:
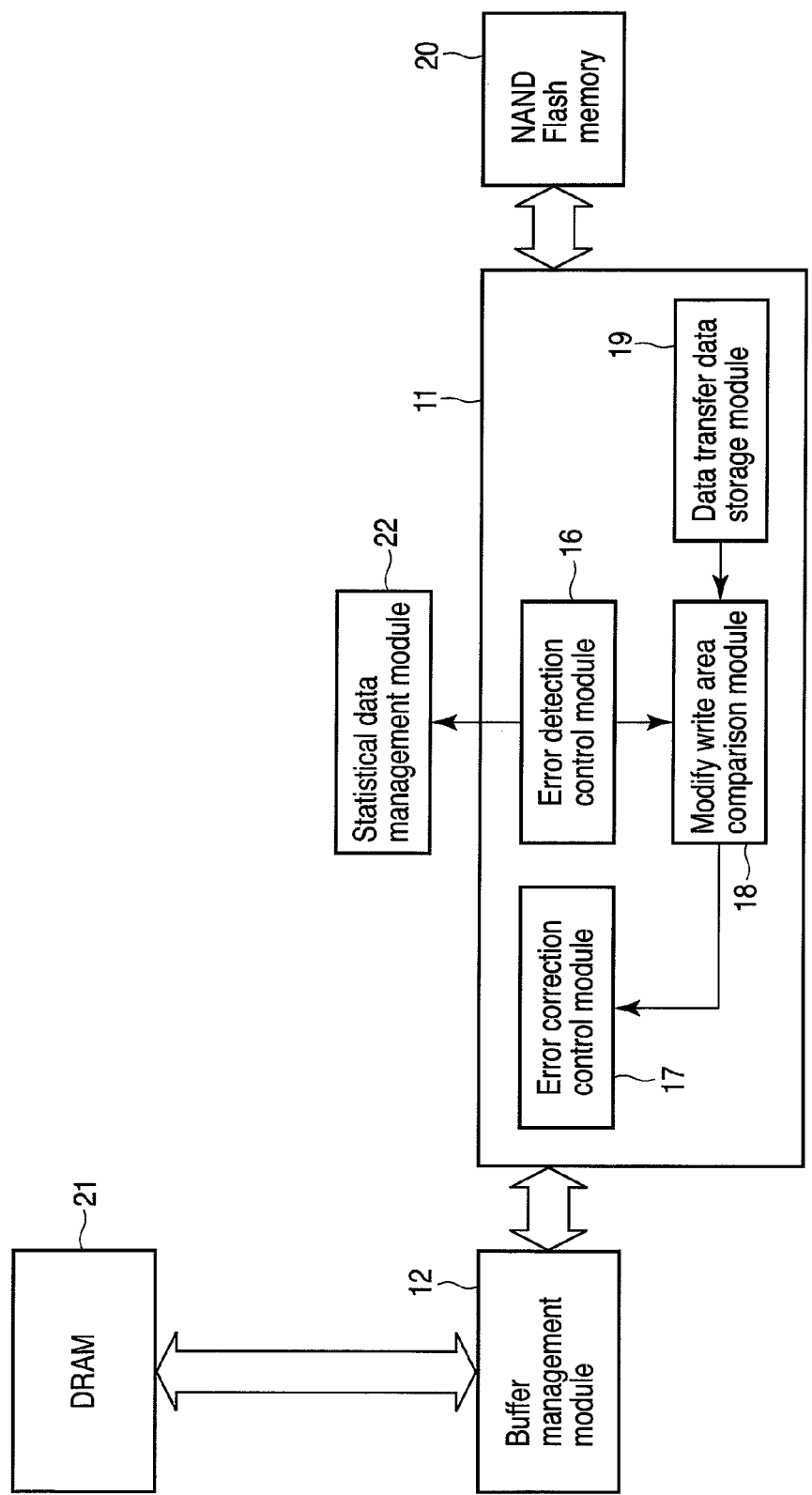
FIG. 2 is a block diagram explaining the configuration of a flash memory controller according to the embodiment.

As shown in FIG. 2, the memory controller 11 has an error detection control module 16, an error correction control module 17, a modify write (MW) area comparison module 18, and a data transfer data storage module 19.

The error detection control module 16 detects errors, if any, in the data read from any flash memory 20. Upon detecting errors, the error detection control module 16 supplies error data (or error notice) to the statistical data management module 22. The error data contains the data item representing the position of the storage areas (holding clusters) of the flash memory 20, at which errors have occurred in the RMW mode.

The statistical data management module 22 manages the statistical data about accesses to the flash memories 20 and reflects error notices on statistical data. More precisely, the statistical data management module 22 accumulates error position data as statistical data and designates any data storage area in which errors have been detected, as an unusable storage area.

The error correction control module 17 receives from the MW area comparison module 18 the data (address) representing the area in which to rewrite data, and also receives the error position data (address) acquired by the error detection control module 16. From these data items (addresses), the error correction control module 17 determines whether error correction should be performed or not. The error correction control module 17 does not perform error correction if the area in which errors are detected by the error detection control module 16 is a rewrite area. If this area is a write-back area, the error correction control module 17 performs error correction.

The MW area comparison module 18 compares the error position data (address) acquired by the MW area comparison module 18, with the data (address) data acquired from the transfer data storage module 19, determining whether the area in which errors are detected is a rewrite area or not. The transfer data storage module 19 stores the area data (address) representing the storage area that holds the data read from a flash memory 20.

[Operation of the Data Storage Apparatus]

How the data storage apparatus according to this embodiment operates will be explained with reference to FIG. 2, FIG. 3, FIG. 4 and FIG. 5.

In this embodiment, the SSD controller 10 accesses a flash memory 20 in response to a command coming from the host system 30, and writes and read data, in unit of clusters, to and from the flash memory 20. In the SSD controller 10, the command is decoded by the subsystem module 14.

To write clusters, one by one, to the flash memory 20, a part of any cluster (for example, three sectors) is rewritten (modified) in this embodiment. This mode of writing data is known as "read modify write," hereinafter referred to as "RMW mode."

As shown in the flowchart of FIG. 5, the memory controller 11 receives an RMW command from the subsystem module 14, and then reads data from that data storage area of the flash memory 20, which has been accessed (Block 501). The memory controller 11 reads data in unit of sectors from the flash memory 20 in normal operating state. The error detection control module 16 performs error detection on the data read from the flash memory 20 in units of sectors.

As shown in FIG. 3, any data storage area (read area) 100 for holding a cluster, from which data is read in the RMW mode, is composed of write-back areas 100A and 100B and a modify write (MW) area 110. The write-back areas 100A and 100B are storage areas for holding data not to be rewritten. By contrast, the modify write area 110 is a storage area for holding data to be written.

If the error detection control module 16 detects no errors (NO in Block 502), the memory controller 11 stores the data read in units of sectors, into the DRAM 21 through the buffer management module 12 (Block 507). The memory controller 11 then writes the data stored in the DRAM 21 and held at the write-back areas 100A and 100B, which should be modified, to the RMW area (write area) of the flash memory 20 (Block 508).

As shown in FIG. 4, the RMW area 200 of the flash memory 20 is composed of write-back areas 200A and 200B and a modify write (MW) area 210. The data read from write-back area 100A is written in write-back area 200A. The data read from write-back area 100B is written in write-back area 200B. The data to rewrite is written in the modify write (MW) area 210. This data rewrite has been obtained by updating the data stored in the modify write area 110 of the read area 100. Note that the RMW area 200 of the flash memory 20 is a physical storage area that differs from the read area 100. It is a vacant area that will be selected in the RMW mode.

The error detection control module 16 may detect errors in the (YES in Block 502). In this case, the MW area comparison module 18 determines whether the errors detected pertain to the data held in the modify write area 110 (Block 503). If the MW area comparison module 18 determines that the errors do not pertain to that data (NO in Block 503), it determines whether the errors can be corrected or not (Block 504). If the errors can be corrected (YES in Block 504), the error correction control module 17 corrects the errors in the data read from write-back area 100A or write-back area 100B, i.e., area other than modify write area 110 (Block 505).

If the error correction control module 17 cannot correct errors (NO in Block 504), the memory controller 11 terminates the RMW, and perform a prescribed error correction process. The prescribed error correction process includes a step of supplying error data containing the error position data, to the statistical data management module 22. The statistical data management module 22 accumulates the error position data as statistical data. In this embodiment, the error position data is a sector held in either write-back area 100A or write-back area 100B.

After the error correction control module 17 has corrected the errors, the error detection control module 16 performs error notification, giving error data to the statistical data management module 22 (Block 506). The memory controller 11 stores the data representing the data corrected in units of sectors by the error correction control module 17, to the DRAM 21 through the buffer management module 12 (Block 507). Next, the memory controller 11 writes the data stored in the DRAM 21 and the data to rewrite in the RMW area (modify write area) 200 of the flash memory 20 (Block 508).

If the decision made by the MW area comparison module 18 shows that errors has been found in the data read from the modify write area 110 (YES in Block 503), the error correction control module 17 does not perform the error correction process. That is, after the error detection control module 16 has performed the error notification, the memory controller 11 stores the data (sectors) 120 found to have no errors, as shown in FIG. 3, into the DRAM 21 through the buffer management module 12 (Block 507).

The statistical data management module 22 accumulates the error position data as statistical data, and manages the storage area in which errors have been detected, as an unusable area. The error position data represents the sectors included in the modify write area 110.

The memory controller 11 first stores the data (containing data 120 having no errors) read from the read area 100 in units of sectors, into the DRAM 21, and then writes the data, which is held in the write-back areas 100A and 100B of the DRAM 21 and which should be rewritten, in the RMW area (modify write area) 200 of the flash memory 20 (Block 508).

As has been described, this embodiment does not perform the error correction process if errors are found in the data read in RMW mode from the modify write area 110 of any flash memory 20. The data read from the modify write area 110 is rewritten (modified) and then written in the RMW area 200. Any data having errors is thus rewritten to desirable data, and imposes no adverse influence on the RMW. This helps to increase the efficiency of data writing.

The error correction process is omitted in the RMW mode, shortening the RMW and ultimately increasing the process efficiency. Since the error notification is performed, the statistical data management module 22 manages the sectors in the modify write area 110 in which errors have been detected.

The error correction needs more time than the error detection that can be performed within a relatively short time. Hence, the time required for the RMW can be effectively reduced because the error correction process is omitted. In other words, the efficiency of data writing to the SSD can be prevented from decreasing. Moreover, the flash memories 20 can become more resistant to errors because they need not undergo any error correction process.

The various modules of the systems described herein can be implemented as software applications, hardware and/or software modules, or components on one or more computers, such as servers. While the various modules are illustrated separately, they may share some or all of the same underlying logic or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage apparatus comprising:
    a flash memory; and
    a controller configured to:
        read data stored in a flash memory, where the data is stored in a write-back area and a modified write area in the flash memory,
        detect errors in the data read from the flash memory, and
        perform a data writing process without correcting the detected errors in the data stored in the modify write area.

2. The data storage apparatus of claim 1, wherein the controller is configured to perform error notification when the controller detects errors in the data stored in either the modify write area or the write-back area.

3. The data storage apparatus of claim 2, wherein the controller is configured to manage statistics regarding accesses to the flash memory and error locations based on at least the error notification.

4. The data storage apparatus of claim 3, wherein the controller is configured to manage memory areas for prescribed access units designated by the error notification as unusable areas.

5. The data storage apparatus of claim 1, wherein when the controller detects an error in the data stored in the write-back area, the controller continues the data writing process after the error has been corrected.

6. The data storage apparatus of claim 1, wherein the controller is configured to stop the data writing process when the controller detects an error in the data stored in the write-back area and when the error cannot be corrected.

7. The data storage apparatus of claim 1, further comprising a buffer memory,
    wherein the controller is configured to:
        store data read from the flash memory into the buffer memory, wherein a first data portion is read from the write-back area; and
        transfer the first data portion from the buffer memory to the modify write area of the flash memory;
    wherein performing the data writing process comprises writing data to modify into the modify write area.

8. The data storage apparatus of claim 7, wherein when the controller detects an error in the data stored in the modify write area, the controller stores in the buffer memory the data stored in the modify write data containing the error.

9. The data storage apparatus of claim 7, wherein when the controller detects an error in the data stored in the write-back area, the controller stores, in the buffer memory, the data after the error has been corrected in the write-back area.

10. A method, implemented on an electronic device, for writing data in a data storage apparatus having a flash memory, the method comprising:
    reading data from the flash memory, where the data is stored in a write-back area and a modify write area in the flash memory;
    detecting errors in the data read from the flash memory; and
    continuing a data writing process, without correcting the errors, when errors are detected in the data read held in the modify write area.

11. The method of claim 10, further comprising
    performing error notification when errors are detected in the data stored in either the modify write area or the write-back area.

12. The method of claim 11, further comprising managing statistics regarding accesses to the flash memory and error locations based on at least the error notification.

13. The method of claim 12, further comprising managing memory areas for prescribed access units designated by the error notification as unusable areas.

14. The method of claim 10, further comprising continuing the data writing process, when an error in the data stored in the write-back area is detected, after the error has been corrected.

15. The method of claim 10, further comprising stopping the data writing process if an error is detected in the data stored in the write-back area and if the error cannot be corrected.

16. The method of claim 10, further comprising
    storing data read from the flash memory into a buffer memory, wherein a first data portion is read from the write-back area; and
    transferring the first data portion from the buffer memory to the modify write area of the flash memory;
    wherein performing the data writing process comprises writing data to modify into the modify write area.

17. The method of claim 16, further comprising, when an error is detected in the data stored in the modify write area, storing in the buffer memory the data stored in the modify write data containing the error.

18. The method of claim 16, further comprising, when an error is detected in the data stored in the write-back area, storing in the buffer memory the data after the error has been corrected in the write-back area.

* * * * *